United States Patent
Ahn

(10) Patent No.: US 10,777,238 B2
(45) Date of Patent: Sep. 15, 2020

(54) CALIBRATION CIRCUIT AND SEMICONDUCTOR APPARATUS INCLUDING THE SAME

(71) Applicant: SK hynix Inc., Icheon-si, Gyeonggi-do (KR)

(72) Inventor: Jung Il Ahn, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/577,090

(22) Filed: Sep. 20, 2019

(65) Prior Publication Data

US 2020/0265878 A1    Aug. 20, 2020

(30) Foreign Application Priority Data

Feb. 18, 2019   (KR) .................. 10-2019-0018480

(51) Int. Cl.
*G11C 7/10* (2006.01)
*H03K 17/687* (2006.01)

(52) U.S. Cl.
CPC .......... *G11C 7/1048* (2013.01); *G11C 7/1051* (2013.01); *H03K 17/6872* (2013.01); *G11C 2207/2254* (2013.01)

(58) Field of Classification Search
None
See application file for complete search history.

(56) References Cited

U.S. PATENT DOCUMENTS 10,090,064 B2   10/2018  Pan
2009/0015312 A1*  1/2009  Kuwahara ............... G11C 7/04
                                                        327/330

* cited by examiner

*Primary Examiner* — Jany Richardson
(74) *Attorney, Agent, or Firm* — William Park & Associates Ltd.

(57) ABSTRACT

A calibration circuit includes a reference resistor leg, a calibration code generation circuit, and an emphasis circuit. The reference resistor leg is coupled to an external reference resistor through a reference resistor node, and changes a voltage level of the reference resistor node based on a calibration code. The emphasis circuit accelerates a voltage level change of the reference resistor node based on the calibration code.

23 Claims, 5 Drawing Sheets

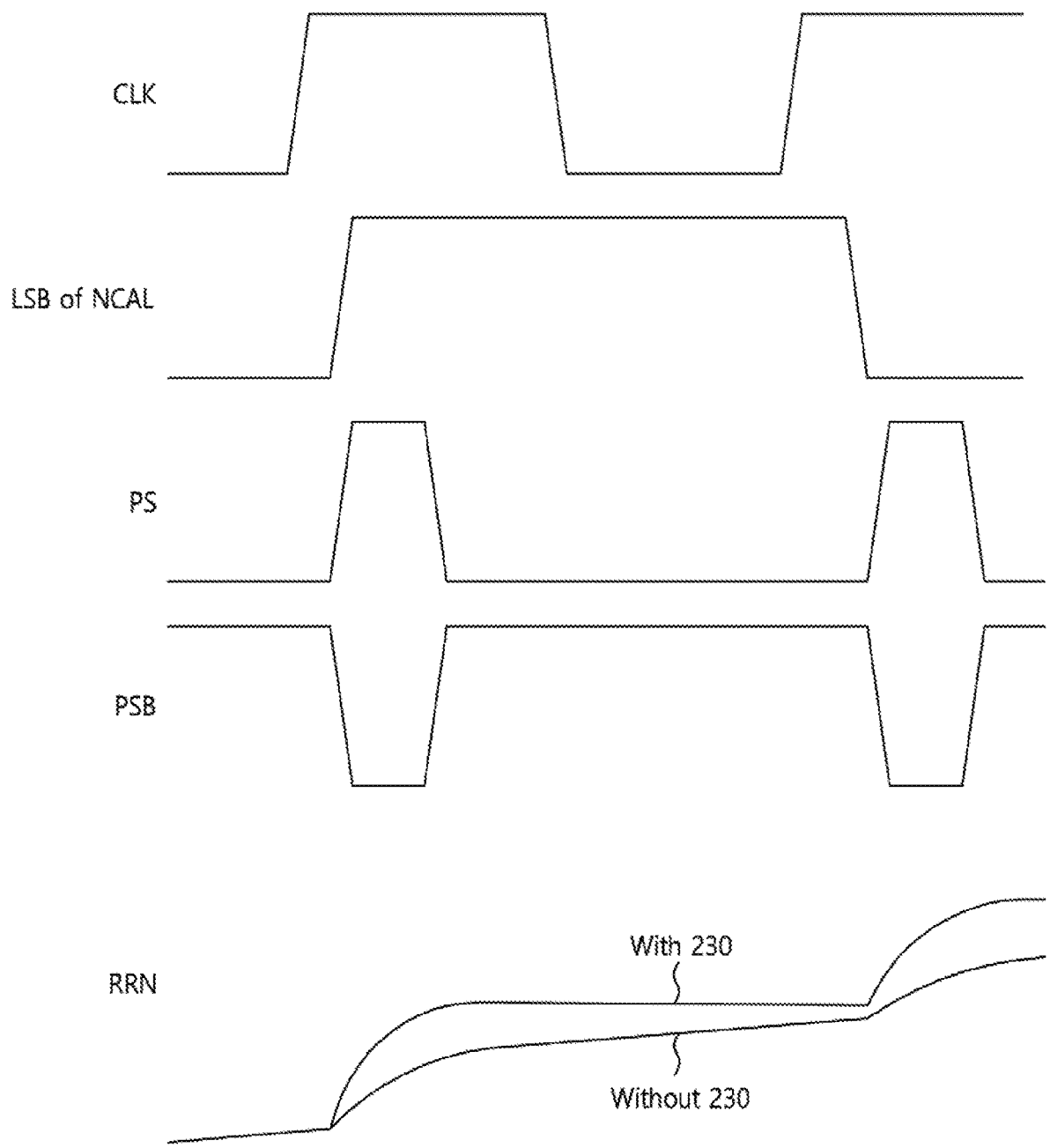

CALIBRATION CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2019-0018480, filed on Feb. 18, 2019, in the Korean Intellectual Property Office, which is incorporated herein by reference in its entirety.

BACKGROUND

1. Technical Field

Various embodiments generally relate to an integrated circuit technology and, more particularly, to a semiconductor apparatus and a calibration circuit.

2. Related Art

Electronic apparatuses may include a large number of electronic components. Among the electronic apparatuses, a computer system may include many electronic components which are constructed by semiconductors. Each of semiconductor apparatuses which construct the computer system may include a data transmission apparatus and thereby, may transmit data. As the operation speeds of semiconductor apparatuses are increased and the power consumptions of the semiconductor apparatuses are reduced, signals, which are transmitted, may be distorted due to the influence of external noise and impedance mismatching between semiconductor apparatuses communicating with each other. Therefore, each of semiconductor apparatuses may perform an operation of matching the impedance or resistance of the data transmission apparatus.

Thus, it is the norm that a semiconductor apparatus includes an on-die termination circuit which performs impedance matching for precise signal transmission. Moreover, the semiconductor apparatus needs to perform a calibration of the termination resistance, depending on a PVT variation, such that a precise impedance matching may be achieved. In general, a memory apparatus is coupled with an external reference resistor, and calibrates the impedance value of the termination resistance by performing a calibration operation using the external reference resistor. This is generally referred to as a ZQ calibration operation.

SUMMARY

In an embodiment, a calibration circuit may include a reference resistor leg and an emphasis circuit. The reference resistor leg may be coupled to an external reference resistor through a reference resistor node, and configured to change a voltage level of the reference resistor node based on a calibration code. The emphasis circuit may be configured to change a voltage level of the reference resistor node based on the calibration code.

In an embodiment, a calibration circuit may include a reference resistor leg, an emphasis control signal generator, and an emphasis driver. The reference resistor leg may be coupled to an external reference resistor through a reference resistor node, and configured to change a voltage level of the reference resistor node based on a calibration code. The emphasis control signal generator may be configured to generate an emphasis control signal based on the calibration code. The emphasis driver may be configured to change a voltage level of the reference resistor node based on the emphasis control signal.

In an embodiment, a semiconductor apparatus may include a plurality of dies. The plurality of dies may be coupled in common with an external reference resistor, and configured to sequentially perform a calibration operation. At least one of the plurality of dies may include a calibration circuit and a data output circuit. The calibration circuit may be coupled with the external reference resistor through a reference resistor pad, and configured to generate a first calibration code and a second calibration code. The data output circuit may be configured to output data by being set in impedance based on the first and second calibration codes. The calibration circuit may include a reference resistor leg and an emphasis circuit. The reference resistor leg may be coupled to a reference resistor node which is coupled with the reference resistor pad, and configured to change a voltage level of the reference resistor node based on the first calibration code. The emphasis circuit may be configured to change a voltage level of the reference resistor node based on the first calibration code.

BRIEF DESCRIPTION OF THE DRAWINGS

FIG. 5 is a diagram illustrating an operation of the calibration circuit in accordance with the embodiment.

DETAILED DESCRIPTION

Figure 1:
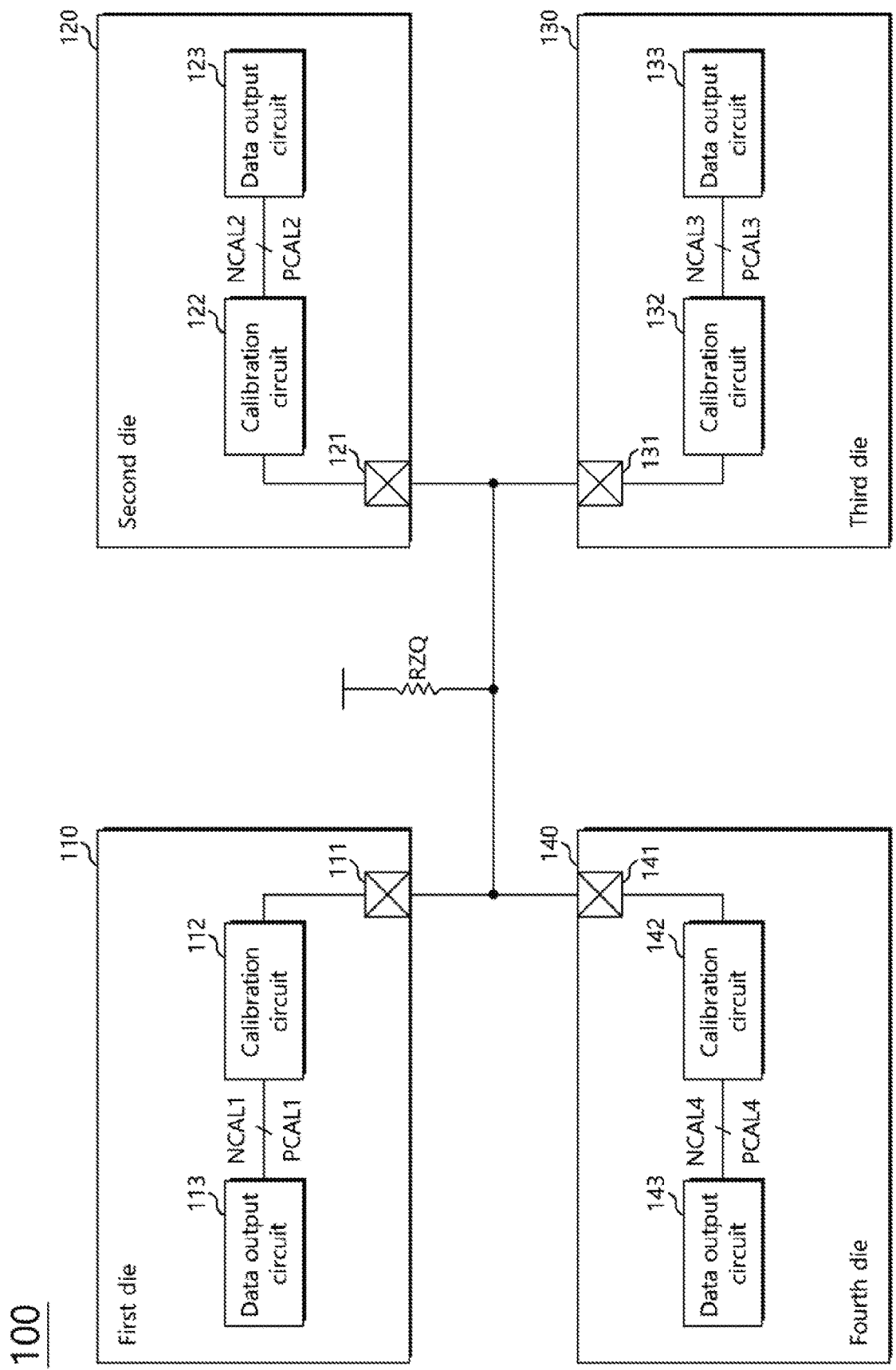
FIG. 1 is a diagram illustrating a configuration of a semiconductor apparatus in accordance with an embodiment.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be modified in various ways and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Hereinafter, a calibration circuit and a semiconductor apparatus including the same will be described below with reference to the accompanying drawings through various examples of embodiments.

FIG. 1 is a diagram, illustrating a configuration of a semiconductor apparatus 100, in accordance with an embodiment. Referring to FIG. 1, the semiconductor apparatus 100 may include a plurality of dies. The semiconductor apparatus 100 may be a stack-type semiconductor apparatus in which a plurality of dies are stacked on one substrate and are packaged into a single package. While FIG. 1 illustrates that the semiconductor apparatus 100 includes four dies, it is to be noted that the disclosure is not limited thereto, and the number of dies to be stacked may be smaller than or greater than 4. While a first die 110, a second die 120, a third die 130 and a fourth die 140 are illustrated as being horizontally stacked on the substrate, this is merely a conceptual illustration, and a part and/or the entirety of the first to fourth dies 110, 120, 130 and 140 may be stacked in various directions, for example, a vertical direction. The first to fourth dies 110, 120, 130 and 140 may be designed to have the same structure, and a part or the entirety thereof may be designed to have a different structure and/or function. Any one die, among the first to fourth dies 110, 120, 130 and 140, may serve as a master die capable of preferentially communicating with an external apparatus (not illustrated), outside the semiconductor apparatus 100, and the remaining dies may serve as slave dies, communicating with the external apparatus through the master die. However, it is to be noted that the disclosure is not limited thereto, and the first to fourth dies 110, 120, 130 and 140 may communicate with the external apparatus independently of one another.

The semiconductor apparatus 100 may include an external reference resistor RZQ which is disposed on the substrate. The first to fourth dies 110, 120, 130 and 140 may be coupled in common with the external reference resistor RZQ. Each of the first to fourth dies 110, 120, 130 and 140 may perform a calibration operation by being coupled with the external reference resistor RZQ. The first to fourth dies 110, 120, 130 and 140 may be coupled in common with the external reference resistor RZQ, and may sequentially perform calibration operations. For example, the first die 110 may first perform the calibration operation. The first die 110 may perform the calibration operation by receiving, from the external apparatus, a command signal, instructing the calibration operation to be performed. When the calibration operation of the first die 110 ends, the second die 120 may perform the calibration operation. When the calibration operation of the second die 120 ends, the third die 130 may perform the calibration operation, and when the calibration operation of the third die 130 ends, the fourth die 140 may perform the calibration operation. When the calibration operation of the fourth die 140 ends, the fourth die 140 may transmit a signal notifying the first die 110 that the calibration operation has ended. If the calibration operations of all the dies 110, 120, 130 and 140 are completed, the first die 110 may output a signal, notifying the external apparatus that a calibration operation of the semiconductor apparatus 100 has completed.

The first to fourth dies 110, 120, 130 and 140 may include reference resistor pads 111, 121, 131 and 141, calibration circuits 112, 122, 132 and 142 and data output circuits 113, 123, 133 and 143, respectively. In the first die 110, the calibration circuit 112 may be coupled to the external reference resistor RZQ, through the reference resistor pad 111, and may perform a calibration operation by using the external reference resistor RZQ. The calibration circuit 112 may generate a first calibration code NCAL1 and a second calibration code PCAL1 by performing the calibration operation. The first and second calibration codes NCAL1 and PCAL1 may set the impedance of the data output circuit 113. The data output circuit 113 may output data to the external apparatus based on the internal data of the first die 110. The data output circuit 113 may be coupled to a data bus and may include a pull-up driver and a pull-down driver which drive the data bus to transmit the data. The pull-up driver may include a plurality of pull-up resistor legs, and the pull-down driver may include a plurality of pull-down resistor legs. The pull-down resistor legs of the data output circuit 113 may be set in their resistance values based on the first calibration code NCAL1. The pull-up resistor legs of the data output circuit 113 may be set in their resistance values based on the second calibration code PCAL1.

In the second die 120, the calibration circuit 122 may be coupled to the external reference resistor RZQ through the reference resistor pad 121, and may perform a calibration operation by using the external reference resistor RZQ. The calibration circuit 122 may generate a first calibration code NCAL2 and a second calibration code PCAL2 by performing the calibration operation. The first and second calibration codes NCAL2 and PCAL2 may set the impedance of the data output circuit 123. The data output circuit 123 may output data to the external apparatus based on the internal data of the second die 120. The data output circuit 123 may be coupled to the data bus and may include a pull-up driver and a pull-down driver which drive the data bus to transmit the data. The pull-up driver may include a plurality of pull-up resistor legs, and the pull-down driver may include a plurality of pull-down resistor legs. The pull-down resistor legs may be set in their resistance values based on the first calibration code NCAL2. The pull-up resistor legs may be set in their resistance values based on the second calibration code PCAL2.

In the third die 130, the calibration circuit 132 may be coupled to the external reference resistor RZQ through the reference resistor pad 131, and may perform a calibration operation by using the external reference resistor RZQ. The calibration circuit 132 may generate a first calibration code NCAL3 and a second calibration code PCAL3 by performing the calibration operation. The first and second calibration codes NCAL3 and PCAL3 may set the impedance of the data output circuit 133. The data output circuit 133 may output data to the external apparatus based on the internal data of the third die 130. The data output circuit 133 may be coupled to the data bus and may include a pull-up driver and a pull-down driver which drive the data bus to transmit the data. The pull-up driver may include a plurality of pull-up resistor legs, and the pull-down driver may include a plurality of pull-down resistor legs. The pull-down resistor legs may be set in their resistance values based on the first calibration code NCAL3. The pull-up resistor legs may be set in their resistance values based on the second calibration code PCAL3.

In the fourth die 140, the calibration circuit 142 may be coupled to the external reference resistor RZQ through the reference resistor pad 141, and may perform a calibration operation by using the external reference resistor RZQ. The calibration circuit 142 may generate a first calibration code NCAL4 and a second calibration code PCAL4 by performing the calibration operation. The first and second calibration codes NCAL4 and PCAL4 may set the impedance of the data output circuit 143. The data output circuit 143 may output data to the external apparatus based on the internal data of the fourth die 140. The data output circuit 143 may be coupled to the data bus and may include a pull-up driver and a pull-down driver which drive the data bus to transmit the data. The pull-up driver may include a plurality of pull-up resistor legs, and the pull-down driver may include a plurality of pull-down resistor legs. The pull-down resistor legs may be set in their resistance values based on the first calibration code NCAL4. The pull-up resistor legs may be set in their resistance values based on the second calibration code PCAL4.

The external reference resistor RZQ may have one end which is coupled to a voltage terminal, and the other end which is coupled in common to the reference resistor pads 111, 121, 131 and 141 of the first to fourth dies 110, 120, 130 and 140. The voltage terminal may be a power supply voltage terminal to which a power supply voltage is supplied. The power supply voltage may have a level higher than a ground voltage and may be an operating power supply voltage of the semiconductor apparatus 100, which is applied from an external power supply of the semiconductor apparatus 100. When the external reference resistor RZQ is coupled with the power supply voltage terminal, the calibration circuits 112, 122, 132 and 142 of the first to fourth dies 110, 120, 130 and 140 may generate first the first calibration codes NCAL1, NCAL2, NCAL3 and NCAL4 and may then generate the second calibration codes PCAL1, PCAL2, PCAL3 and PCAL4 based on the first calibration codes NCAL1, NCAL2, NCAL3 and NCAL4. In an embodiment, the voltage terminal may be a ground voltage terminal which is coupled to a ground voltage. When the external reference resistor RZQ is coupled to the ground voltage terminal, the calibration circuits 112, 122, 132 and 142 of the first to fourth dies 110, 120, 130 and 140 may generate first the second calibration codes PCAL1, PCAL2, PCAL3 and PCAL4 and may then generate the first calibration codes NCAL1, NCAL2, NCAL3 and NCAL4 based on the second calibration codes PCAL1, PCAL2, PCAL3 and PCAL4.

Figure 2:
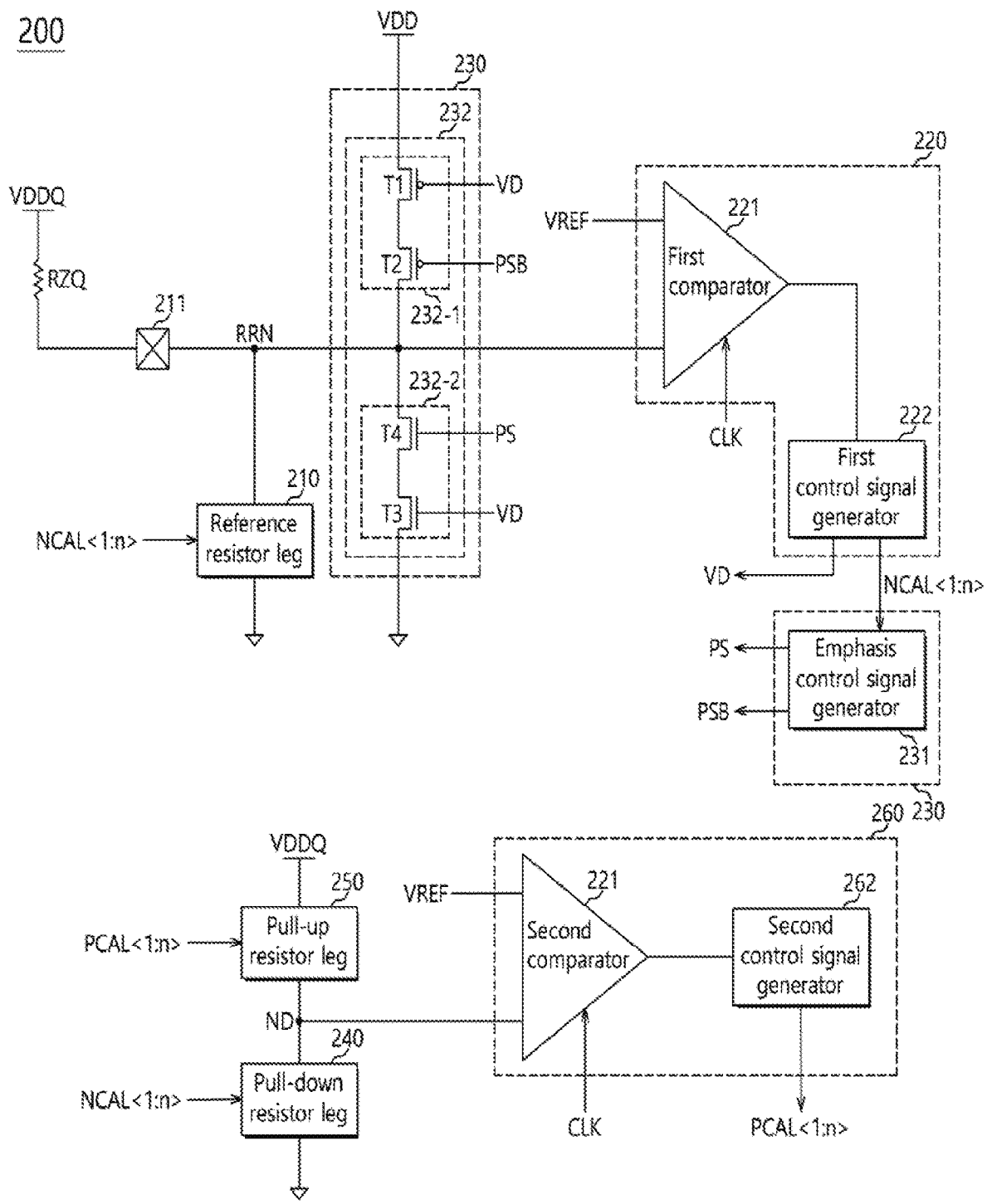
FIG. 2 is a diagram illustrating a configuration of a calibration circuit in accordance with an embodiment.

FIG. 2 is a diagram illustrating a configuration of a calibration circuit 200, in accordance with an embodiment. The calibration circuit 200 may be applied to some or all of the calibration circuits 112, 122, 132 and 142, illustrated in FIG. 1. The calibration circuit 200 may include a reference resistor leg 210, a first calibration code generation circuit 220 and an emphasis circuit 230.

Referring to FIG. 2, the calibration circuit 200 may be coupled to an external reference resistor RZQ through a reference resistor pad 211. The reference resistor pad 211 may be coupled to a reference resistor node RRN. The reference resistor leg 210 may be coupled to the external reference resistor RZQ through the reference resistor node RRN and the reference resistor pad 211. The reference resistor leg 210 may receive a first calibration code NCAL<1:n> and may be set to a resistance value based on the first calibration code NCAL<1:n>. The resistance value of the reference resistor leg 210 may be changed based on the first calibration code NCAL<1:n>. The external reference resistor RZQ may have one end coupled to a terminal of a first power supply voltage VDDQ and the other end coupled to the reference resistor node RRN through the reference resistor pad 211. The reference resistor leg 210 may have one end coupled to the reference resistor node RRN and the other end coupled to a terminal of a ground voltage VSS. The voltage level of the reference resistor node RRN may be determined between the first power supply voltage VDDQ and the ground voltage VSS, depending on the resistance ratio of the external reference resistor RZQ and the reference resistor leg 210. Therefore, the reference resistor leg 210 may change the voltage level of the reference resistor node RRN based on the first calibration code NCAL<1:n>.

The first calibration code generation circuit 220 may be coupled to the reference resistor node RRN. The first calibration code generation circuit 220 may compare the voltage level of the reference resistor node RRN and the voltage level of a reference voltage VREF. The reference voltage VREF may have a voltage level corresponding to a middle of the first power supply voltage VDDQ and the ground voltage VSS. The first calibration code generation circuit 220 may generate a voltage detection signal VD and the first calibration code NCAL<1:n> by comparing the voltage level of the reference resistor node RRN and the reference voltage VREF. The first calibration code generation circuit 220 may generate the voltage detection signal VD and the first calibration code NCAL<1:n> based on a result of comparing the voltage levels of the reference resistor node RRN and the reference voltage VREF. For example, the first calibration code generation circuit 220 may transition the level of the voltage detection signal VD to a logic high level when the voltage level of the reference resistor node RRN is higher than the reference voltage VREF. On the other hand, the first calibration code generation circuit 220 may transition the level of the voltage detection signal VD to a logic low level when the voltage level of the reference resistor node RRN is lower than the reference voltage VREF. When the voltage level of the reference resistor node RRN is higher than the reference voltage VREF, the first calibration code generation circuit 220 may change the code value of the first calibration code NCAL<1:n> such that the resistance value of the reference resistor leg 210 may be decreased. For example, the first calibration code generation circuit 220 may increase the code value of the first calibration code NCAL<1:n>. When the voltage level of the reference resistor node RRN is lower than the reference voltage VREF, the first calibration code generation circuit 220 may change the code value of the first calibration code NCAL<1:n> such that the resistance value of the reference resistor leg 210 may be increased. For example, the first calibration code generation circuit 220 may decrease the code value of the first calibration code NCAL<1:n>.

The emphasis circuit 230 may change the voltage level of the reference resistor node RRN based on the first calibration code NCAL<1:n> and the voltage detection signal VD. The emphasis circuit 230 may additionally change the voltage level of the reference resistor node RRN when the voltage level of the reference resistor node RRN is changed, depending on a change in the resistance value of the reference resistor leg 210. The emphasis circuit 230 may perform an emphasis operation to boost a change in the voltage level of the reference resistor node RRN. The emphasis circuit 230 may cooperatively raise the voltage level of the reference resistor node RRN when the reference resistor leg 210 raises the voltage level of the reference resistor node RRN based on the first calibration code NCAL<1:n>. The emphasis circuit 230 may cooperatively lower the voltage level of the reference resistor node RRN when the reference resistor leg 210 lowers the voltage level of the reference resistor node RRN based on the first calibration code NCAL<1:n>. The emphasis circuit 230 may change the voltage level of the reference resistor node RRN by detecting a change in the code value of the first calibration code NCAL<1:n>. The emphasis circuit 230 may change the voltage level of the reference resistor node RRN based on at least a part of the first calibration code NCAL<1:n>. Detailed description for this will be made later.

The first calibration code generation circuit 220 may include a first comparator 221 and a first control signal generator 222. The first comparator 221 may be coupled with the reference resistor node RRN and may receive the reference voltage VREF. The first comparator 221 may compare the voltage level of the reference resistor node RRN and the reference voltage VREF. For example, the first comparator 221 may output a signal, which has a logic high level, when the voltage level of the reference resistor node RRN is higher than the reference voltage VREF. Additionally, the first comparator 221 may output a signal, which has a logic low level, when the voltage level of the reference resistor node RRN is lower than the reference voltage VREF. The first comparator 221 may further receive a clock signal CLK. The first comparator 221 may perform a voltage comparison operation in synchronization with the clock signal CLK. For example, the first comparator 221 may perform an operation of comparing the voltage level of the reference resistor node RRN and the reference voltage VREF in synchronization with an edge of the clock signal CLK. The first comparator 221 may perform the voltage comparison operation in synchronization with the rising edge of the clock signal CLK. In an embodiment, the first comparator 221 may perform the voltage comparison operation in synchronization with both the rising edge and falling edge of the clock signal CLK.

The first control signal generator 222 may receive the signal outputted from the first comparator 221 and thereby generate the voltage detection signal VD and the first calibration code NCAL<1:n>. The first control signal generator 222 may transition the logic level of the voltage detection signal VD and increase or decrease the code value of the first calibration code NCAL<1:n>, based on the output of the first comparator 221. For example, when a signal having a logic high level is outputted from the first comparator 221, the first control signal generator 222 may transition the voltage detection signal VD to a logic high level and increase the code value of the first calibration code NCAL<1:n>. When a signal, having a logic low level, is outputted from the first comparator 221, the first control signal generator 222 may transition the voltage detection signal VD to a logic low level and decrease the code value of the first calibration code NCAL<1:n>.

The emphasis circuit 230 may include an emphasis control signal generator 231 and an emphasis driver 232. The emphasis control signal generator 231 may receive the first calibration code NCAL<1:n> from the first control signal generator 222 of the first calibration code generation circuit 220. The emphasis control signal generator 231 may generate an emphasis control signal PS based on the first calibration code NCAL<1:n>. The emphasis control signal generator 231 may generate a complementary signal PSB, together with the emphasis control signal PS. The emphasis control signal generator 231 may generate the emphasis control signal PS based on at least a part of the first calibration code NCAL<1:n>. For example, the emphasis control signal generator 231 may generate the emphasis control signal PS by detecting the transition of the least significant bit (LSB) of the first calibration code NCAL<1:n>. The emphasis control signal generator 231 may enable the emphasis control signal PS and the complementary signal PSB each time the logic level of the least significant bit (LSB) of the first calibration code NCAL<1:n> transitions.

Referring to FIG. 2, the emphasis driver 232 may receive the voltage detection signal VD and the emphasis control signal PS. The emphasis driver 232 may change the voltage level of the reference resistor node RRN based on the voltage detection signal VD and the emphasis control signal PS. The emphasis driver 232 may raise the voltage level of the reference resistor node RRN based on the voltage detection signal VD and the emphasis control signal PS when the voltage level of the reference resistor node RRN is lower than the reference voltage VREF. The emphasis driver 232 may lower the voltage level of the reference resistor node RRN based on the voltage detection signal VD and the emphasis control signal PS when the voltage level of the reference resistor node RRN is higher than the reference voltage VREF.

The emphasis driver 232 may include a pull-up emphasis driver 232-1 and a pull-down emphasis driver 232-2. The pull-up emphasis driver 232-1 may receive the voltage detection signal VD and the complementary signal PSB of the emphasis control signal PS. The pull-up emphasis driver 232-1 may raise the voltage level of the reference resistor node RRN based on the voltage detection signal VD and the complementary signal PSB of the emphasis control signal PS. The pull-down emphasis driver 232-2 may receive the voltage detection signal VD and the emphasis control signal PS. The pull-down emphasis driver 232-2 may lower the voltage level of the reference resistor node RRN based on the voltage detection signal VD and the emphasis control signal PS. The pull-up emphasis driver 232-1 may be coupled between a terminal of a second power supply voltage VDD and the reference resistor node RRN, and thereby, may pull-up drive the reference resistor node RRN. The pull-down emphasis driver 232-2 may be coupled between the reference resistor node RRN and a terminal of the ground voltage VSS, and thereby, may pull-down drive the reference resistor node RRN.

In an embodiment, the second power supply voltage VDD may have the same voltage level as the first power supply voltage VDDQ. When the first power supply voltage VDDQ and the second power supply voltage VDD have the same voltage level, a terminal which supplies the first power supply voltage VDDQ and a terminal which supplies the second power supply voltage VDD may be electrically isolated from each other. In an embodiment, the second power supply voltage VDD may have a voltage level different from the first power supply voltage VDDQ, and may have a voltage level higher than the first power supply voltage VDDQ. In an embodiment, the ground voltage terminal to which the reference resistor leg 210 is coupled may be a terminal of a first ground voltage VSSQ, and a ground voltage terminal to which the pull-down emphasis driver 232-2 is coupled may be a terminal of a second ground voltage VSS. The terminal of the first ground voltage VSSQ and the terminal of the second ground voltage VSS may be electrically isolated from each other.

The pull-up emphasis driver 232-1 may include a first transistor T1 and a second transistor T2. The first and second transistors T1 and T2 may be P-channel MOS transistors. The first transistor T1 may have a gate which receives the voltage detection signal VD and a source which is coupled with the terminal of the second power supply voltage VDD. The second transistor T2 may have a gate which receives the complementary signal PSB of the emphasis control signal PS, a source which is coupled with the drain of the first transistor T1 and a drain which is coupled with the reference resistor node RRN. The pull-up emphasis driver 232-1 may pull-up drive the reference resistor node RRN to the second power supply voltage VDD when the voltage detection signal VD has a logic low level and the complementary signal PSB of the emphasis control signal PS is enabled to a logic low level.

The pull-down emphasis driver 232-2 may include a third transistor T3 and a fourth transistor T4. The third and fourth transistors T3 and T4 may be N-channel MOS transistors. The third transistor T3 may have a gate which receives the voltage detection signal VD and a source which is coupled with the terminal of the ground voltage VSS. The fourth transistor T4 may have a gate which receives the emphasis control signal PS, a drain which is coupled with the reference resistor node RRN and a source which is coupled with the drain of the third transistor T3. The pull-down emphasis driver 232-2 may pull-down drive the reference resistor node RRN to the ground voltage VSS when the voltage detection signal VD has a logic high level and the emphasis control signal PS is enabled to a logic high level.

Referring again to FIG. 2, the calibration circuit 200 may further include a pull-down resistor leg 240, a pull-up resistor leg 250 and a second calibration code generation circuit 260. The pull-down resistor leg 240 may receive the first calibration code NCAL<1:n>. The pull-down resistor leg 240 may be set to a resistance value based on the first calibration code NCAL<1:n>. The resistance value of the pull-down resistor leg 240 may be changed based on the first calibration code NCAL<1:n>. The pull-down resistor leg 240 may be coupled between a node ND and a terminal of the ground voltage VSS. The pull-down resistor leg 240 may be set to the same resistance value as the reference resistor leg 210 based on the first calibration code NCAL<1:n>. The pull-up resistor leg 250 may receive a second calibration code PCAL<1:n>. The pull-up resistor leg 250 may be set to a resistance value based on the second calibration code PCAL<1:n>. The resistance value of the pull-up resistor leg 250 may be changed based on the second calibration code PCAL<1:n>. The pull-up resistor leg 250 may be coupled between a terminal of the first power supply voltage VDDQ and the node ND.

The second calibration code generation circuit 260 may generate the second calibration code PCAL<1:n> by detecting a voltage level which changes depending on the resistance ratio of the pull-up resistor leg 250 and the pull-down resistor leg 240. The second calibration code generation circuit 260 may be coupled with the node ND, and may generate the second calibration code PCAL<1:n> by comparing the voltage level of the node ND and the level of the reference voltage VREF. When the voltage level of the node ND is higher than the reference voltage VREF, the second calibration code generation circuit 260 may change the code value of the second calibration code PCAL<1:n> such that the resistance value of the pull-up resistor leg 250 is increased. For example, the second calibration code generation circuit 260 may decrease the code value of the second calibration code PCAL<1:n>. When the voltage level of the node ND is lower than the reference voltage VREF, the second calibration code generation circuit 260 may change the code value of the second calibration code PCAL<1:n> such that the resistance value of the pull-up resistor leg 250 is reduced. For example, the second calibration code generation circuit 260 may increase the code value of the second calibration code PCAL<1:n>.

The second calibration code generation circuit 260 may include a second comparator 261 and a second control signal generator 262. The second comparator 261 may be coupled with the node ND, and may receive the reference voltage VREF. The second comparator 261 may compare the voltage level of the node ND and the reference voltage VREF. For example, the second comparator 261 may output a signal which has a logic high level, when the voltage level of the node ND is higher than the reference voltage VREF, and may output a signal which has a logic low level, when the voltage level of the node ND is lower than the reference voltage VREF. The second comparator 261 may further receive the clock signal CLK. The second comparator 261 may perform a voltage comparison operation in synchronization with the clock signal CLK. For example, the second comparator 261 may perform an operation of comparing the voltage level of the node ND and the reference voltage VREF in synchronization with the rising edge of the clock signal CLK.

The second control signal generator 262 may receive the signal, outputted from the second comparator 261, and thereby generate the second calibration code PCAL<1:n>. The second control signal generator 262 may decrease the code value of the second calibration code PCAL<1:n> when a signal having a logic high level is outputted from the second comparator 261. The second control signal generator 262 may increase the code value of the second calibration code PCAL<1:n> when a signal having a logic low level is outputted from the second comparator 261.

Figure 3:
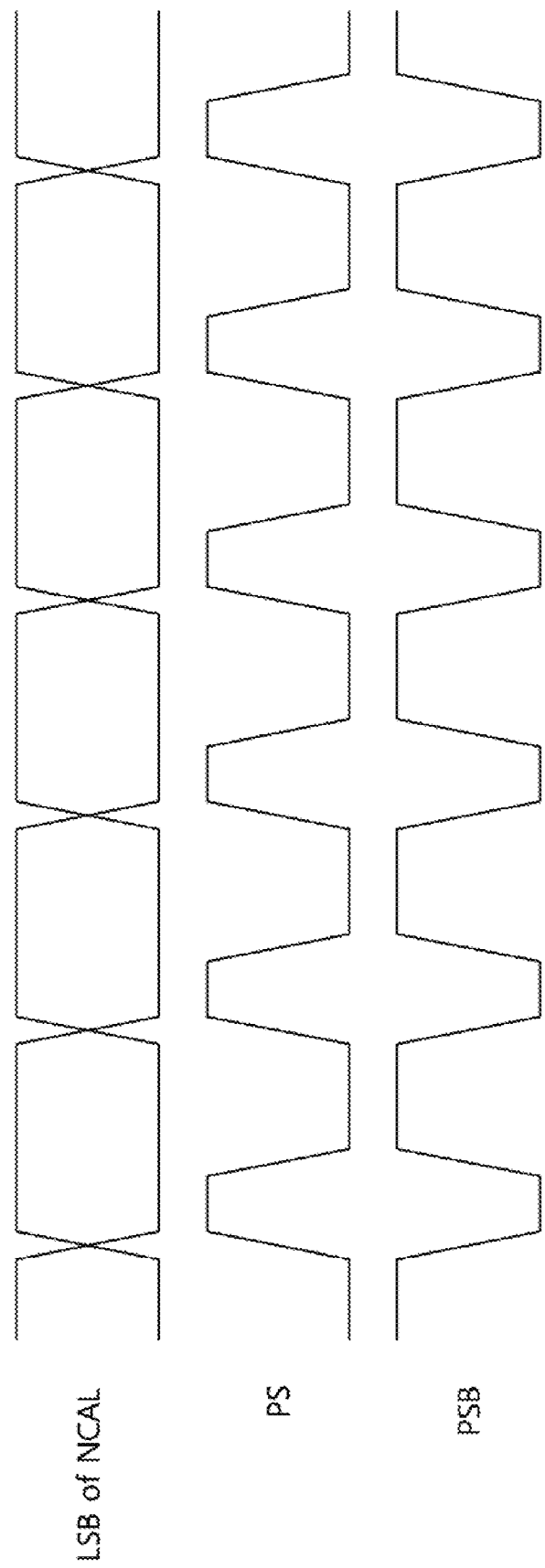
FIG. 3 is a diagram illustrating an operation of the emphasis control signal generator illustrated in FIG. 2.

FIG. 3 is a diagram illustrating an operation of the emphasis control signal generator 231, illustrated in FIG. 2. Referring to FIG. 3, the emphasis control signal generator 231 may enable the emphasis control signal PS to a logic high level and enable the complementary signal PSB of the emphasis control signal PS to a logic low level each time the logic level of the least significant bit (LSB) of the first calibration code NCAL<1:n> transitions. The least significant bit (LSB) of the first calibration code NCAL<1:n> may be most frequently changed in its logic level among the bits of the first calibration code NCAL<1:n> based on a voltage comparison result of the first comparator 221. Therefore, the emphasis control signal generator 231 may generate the emphasis control signal PS and the complementary signal PSB each time the voltage level of the reference resistor node RRN is changed based on the first calibration code NCAL<1:n>, by detecting the least significant bit (LSB) of the first calibration code NCAL<1:n>. In an embodiment, the emphasis control signal generator 231 may generate the emphasis control signal PS and the complementary signal PSB by detecting the logic level transition of another bit other than the least significant bit (LSB).

Figure 4A:
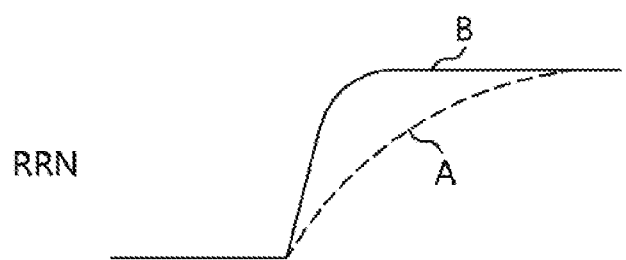
FIGS. 4A and 4B are diagrams illustrating voltage level changes of a reference resistor node.
Figure 4B:
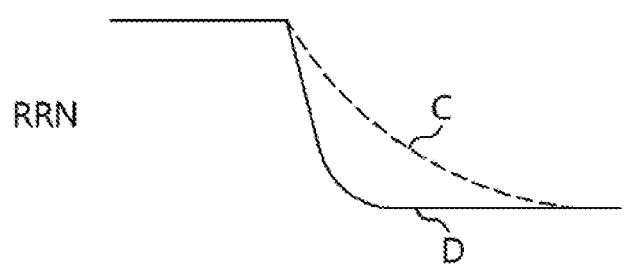

FIGS. 4A and 4B are diagrams illustrating voltage level changes of the reference resistor node RRN. FIG. 4A is a drawing illustrating that, based on the first calibration code NCAL<1:n>, the resistance value of the reference resistor leg 210 increases, thereby raising the voltage level of the reference resistor node RRN. In the case where a plurality of dies are coupled in common with one external reference resistor RZQ as illustrated in FIG. 1, the load and/or the capacitance of the reference resistor pad of each of the plurality of dies may increase when compared to the case where one die is coupled with the external reference resistor RZQ. Therefore, in the case where the emphasis circuit 230, illustrated in FIG. 2, is not included, when the voltage level of the reference resistor node RRN is raised as the resistance value of the reference resistor leg 210 is increased, a voltage level rising slope may decrease like the curve A illustrated by the dotted line. In the case where the emphasis circuit 230 is included, when the voltage level of the reference resistor node RRN is raised, the emphasis circuit 230 may additionally boost the voltage level of the reference resistor node RRN. Thus, a voltage level rising slope may increase like the curve B illustrated by the solid line, and the voltage level of the reference resistor node RRN may be quickly raised and be quickly stabilized to a target voltage level.

FIG. 4B is a drawing illustrating that, based on the first calibration code NCAL<1:n>, the resistance value of the reference resistor leg 210 decreases, thereby lowering the voltage level of the reference resistor node RRN. In the case where the emphasis circuit 230 illustrated in FIG. 2 is not included, when the voltage level of the reference resistor node RRN is lowered as the resistance value of the reference resistor leg 210 is decreased, a voltage level falling slope may decrease like the curve C illustrated by the dotted line. In the case where the emphasis circuit 230 is included, when the voltage level of the reference resistor node RRN is lowered, the emphasis circuit 230 may additionally boost the voltage level of the reference resistor node RRN. Thus, a voltage level falling slope may increase like the curve D illustrated by the solid line, and the voltage level of the reference resistor node RRN may be quickly lowered and be quickly stabilized to a target voltage level.

FIG. 5 is a diagram illustrating an operation of the calibration circuit 200 in accordance with the embodiment. The operations of the calibration circuit 200 and the semiconductor apparatus 100, in accordance with the embodiments, will be described hereunder with reference to FIGS. 1, 2 and 5. If the rising edge of the clock signal CLK is generated to perform the calibration operation of the semiconductor apparatus 100, the first comparator 221 may compare the voltage level of the reference resistor node RRN and the reference voltage VREF. In the case where the voltage level of the reference resistor node RRN is lower than the level of the reference voltage VREF, the first control signal generator 222 may transition the voltage detection signal VD to a logic low level, and may decrease the code value of the first calibration code NCAL<1:n> to increase the resistance value of the reference resistor leg 210. If the code value of the first calibration code NCAL<1:n> is decreased, the logic level of the least significant bit (LSB) of the first calibration code NCAL<1:n> may transition. If the logic level of the least significant bit (LSB) transitions from a low level to a high level, the emphasis control signal generator 231 may detect the logic level transition of the least significant bit of the first calibration code NCAL<1:n> and may enable the emphasis control signal PS to a logic high level and enable the complementary signal PSB to a logic low level. The resistance value of the reference resistor leg 210 may be increased according to the decreased code value of the first calibration code NCAL<1:n>, and the voltage level of the reference resistor node RRN may be raised. Since the voltage detection signal VD has a logic low level, the pull-up emphasis driver 232-1 may pull-up drive the reference resistor node RRN and thereby accelerate the voltage level rise of the reference resistor node RRN, and the voltage level of the reference resistor node RRN may be quickly stabilized to a target voltage level.

If the next rising edge of the clock signal CLK is generated, the first comparator 221 may compare, again, the voltage level of the reference resistor node RRN and the reference voltage VREF. In the case where the emphasis circuit 230 is not included, the voltage level of the reference resistor node RRN may not reach the target voltage level, whereas in the case where the emphasis circuit 230 is included, the voltage level of the reference resistor node RRN may reach the target voltage level. Accordingly, in the embodiments of the disclosure, a calibration operation may be performed by comparing the voltage level of the reference resistor node RRN which has reached the target voltage level and the reference voltage VREF, whereby it is possible to perform an accurate calibration operation. Further, the voltage level of the reference resistor node RRN may be quickly stabilized to the target voltage level, whereby the period of a voltage comparison operation may be reduced. Therefore, a time required to perform a calibration operation may be shortened. In the case where the voltage level of the reference resistor node RRN is lower than the reference voltage VREF as a comparison result of the first comparator 221, the first control signal generator 222 may maintain the logic level of the voltage detection signal VD at a logic low level, and may decrease the code value of the first calibration code NCAL<1:n>. As the code value of the first calibration code NCAL<1:n> is decreased, the logic level of the least significant bit (LSB) may transition from a logic high level to a logic low level. The emphasis control signal generator 231 may detect the transition of the least significant bit (LSB), and thereby, may enable the emphasis control signal PS to a logic high level and enable the complementary signal PSB to a logic low level. The resistance value of the reference resistor leg 210 may be increased according to the decreased code value of the first calibration code NCAL<1: n>, and the voltage level of the reference resistor node RRN may be raised. The pull-up emphasis driver 232-1 may pull-up drive the reference resistor node RRN, and thereby, may accelerate the voltage level rise of the reference resistor node RRN and cause the voltage level of the reference resistor node RRN to be quickly stabilized to a new target voltage level.

If the generation of the first calibration code NCAL<1:n> is completed, the resistance value of the pull-down resistor leg 240 may be set based on the first calibration code NCAL<1:n>. The second calibration code generation circuit 260 may increase or decrease the code value of the second calibration code PCAL<1:n> by comparing the voltage level of the node ND, which is changed depending on the resistance ratio of the pull-up resistor leg 250 and the pull-down resistor leg 240, with the reference voltage VREF. If the generation of the second calibration code PCAL<1:n> is completed, the calibration operation may be ended.

While various embodiments have been described above, it will be understood to those skilled in the art that the embodiments described are examples only. Accordingly, the calibration circuit and the semiconductor apparatus including the same described herein should not be limited based on the described embodiments.

What is claimed is:

1. A calibration circuit comprising:
a reference resistor leg coupled to an external reference resistor through a reference resistor node, and configured to change a voltage level of the reference resistor node based on a calibration code;
a calibration code generation circuit configured to generate a voltage detection signal and the calibration code by comparing the voltage level of the reference resistor node and a reference voltage; and
an emphasis circuit configured to change a voltage level of the reference resistor node based on the calibration code and the voltage detection signal, when the reference resistor leg changes the voltage level of the reference resistor node.

2. The calibration circuit according to claim 1, wherein the calibration code generation circuit transitions a logic level of the voltage detection signal and increases or decrease a code value of the calibration code based on a result of comparing a voltage level of the reference resistor node and the reference voltage.

3. The calibration circuit according to claim 1, wherein the emphasis circuit comprises:
an emphasis control signal generator configured to generate an emphasis control signal based on the calibration code; and
an emphasis driver configured to change a voltage level of the reference resistor node based on the voltage detection signal and the emphasis control signal.

4. The calibration circuit according to claim 3, wherein the emphasis control signal generator enables the emphasis control signal by detecting a transition of a bit of the calibration code.

5. The calibration circuit according to claim 3, wherein the emphasis driver raises a voltage level of the reference resistor node based on the voltage detection signal and the emphasis control signal when a voltage level of the reference resistor node is lower than the reference voltage, and lowers a voltage level of the reference resistor node based on the voltage detection signal and the emphasis control signal when a voltage level of the reference resistor node is higher than the reference voltage.

6. The calibration circuit according to claim 3, wherein the emphasis driver comprises:
a pull-up emphasis driver configured to raise a voltage level of the reference resistor node based on the voltage detection signal and a complementary signal of the emphasis control signal; and
a pull-down emphasis driver configured to lower a voltage level of the reference resistor node based on the voltage detection signal and the emphasis control signal.

7. The calibration circuit according to claim 6,
wherein the external reference resistor is coupled between a terminal of a first power supply voltage and the reference resistor node, and the reference resistor leg is coupled between the reference resistor node and a terminal of a ground voltage, and
wherein the pull-up emphasis driver is coupled between a terminal of a second power supply voltage and the reference resistor node, and the pull-down emphasis driver is coupled between the reference resistor node and a terminal of the ground voltage.

8. The calibration circuit according to claim 7, wherein the second power supply voltage has a voltage level higher than the first power supply voltage.

9. A calibration circuit comprising:
a reference resistor leg coupled to an external reference resistor through a reference resistor node, and configured to change a voltage level of the reference resistor node based on a calibration code;
a calibration code generation circuit configured to generate a voltage detection signal and the calibration code by comparing the voltage level of the reference resistor node with a reference voltage in synchronization with a clock signal;
an emphasis control signal generator configured to generate an emphasis control signal based on the calibration code; and
an emphasis driver configured to change a voltage level of the reference resistor node based on the emphasis control signal.

10. The calibration circuit according to claim 9, wherein the calibration code generation circuit transitions a logic level of the voltage detection signal and increases or decreases a code value of the calibration code, based on a result of comparing a voltage level of the reference resistor node and the reference voltage.

11. The calibration circuit according to claim 9, wherein the emphasis control signal generator enables the emphasis control signal by detecting a transition of a bit of the calibration code.

12. The calibration circuit according to claim 9, wherein the emphasis driver raises a voltage level of the reference resistor node based on the voltage detection signal and the emphasis control signal when a voltage level of the reference resistor node is lower than the reference voltage, and lowers a voltage level of the reference resistor node based on the voltage detection signal and the emphasis control signal when a voltage level of the reference resistor node is higher than the reference voltage.

13. The calibration circuit according to claim 9, wherein the emphasis driver comprises:
a pull-up emphasis driver configured to raise a voltage level of the reference resistor node based on the voltage detection signal and a complementary signal of the emphasis control signal; and
a pull-down emphasis driver configured to lower a voltage level of the reference resistor node based on the voltage detection signal and the emphasis control signal.

14. The calibration circuit according to claim 13,
wherein the external reference resistor is coupled between a terminal of a first power supply voltage and the reference resistor node, and the reference resistor leg is coupled between the reference resistor node and a terminal of a ground voltage, and
wherein the pull-up emphasis driver is coupled between a terminal of a second power supply voltage and the reference resistor node, and the pull-down emphasis driver is coupled between the reference resistor node and a terminal of the ground voltage.

15. The calibration circuit according to claim 14, wherein the second power supply voltage has a voltage level higher than the first power supply voltage.

16. A semiconductor apparatus comprising:
a plurality of dies coupled in common with an external reference resistor, and configured to sequentially perform a calibration operation,
at least one of the plurality of dies comprising:
a calibration circuit coupled to the external reference resistor through a reference resistor pad, and configured to generate a first calibration code and a second calibration code; and
a data output circuit configured to output data by being set in impedance based on the first and second calibration codes,
the calibration circuit comprising:

a reference resistor leg coupled to a reference resistor node which is coupled to the reference resistor pad, and configured to change a voltage level of the reference resistor node based on the first calibration code;

a first calibration code generation circuit configured to generate a voltage detection signal and the calibration code by comparing the voltage level of the reference resistor node and a reference voltage; and an emphasis circuit configured to change a voltage level of the reference resistor node based on the first calibration code and the voltage detection signal, when the reference resistor leg changes the voltage level of the reference resistor node.

17. The semiconductor apparatus according to claim 16, wherein the emphasis circuit raises a voltage level of the reference resistor node based on the voltage detection signal and the first calibration code, when the reference resistor leg raises a voltage level of the reference resistor node based on the first calibration code, and wherein the emphasis circuit lowers a voltage level of the reference resistor node based on the voltage detection signal and the first calibration code, when the reference resistor leg lowers a voltage level of the reference resistor node based on the first calibration code.

18. The semiconductor apparatus according to claim 16, wherein the emphasis circuit comprises:

an emphasis control signal generator configured to generate an emphasis control signal based on the first calibration code; and an emphasis driver configured to change a voltage level of the reference resistor node based on the voltage detection signal and the emphasis control signal.

19. The semiconductor apparatus according to claim 18, wherein the emphasis control signal generator enables the emphasis control signal by detecting a transition of a bit of the first calibration code.

20. The semiconductor apparatus according to claim 18, wherein the emphasis driver comprises:

a pull-up emphasis driver configured to raise a voltage level of the reference resistor node based on the voltage detection signal and a complementary signal of the emphasis control signal; and a pull-down emphasis driver configured to lower a voltage level of the reference resistor node based on the voltage detection signal and the emphasis control signal.

21. The semiconductor apparatus according to claim 20, wherein the external reference resistor is coupled between a terminal of a first power supply voltage and the reference resistor node, and the reference resistor leg is coupled between the reference resistor node and a terminal of a ground voltage, and wherein the pull-up emphasis driver is coupled between a terminal of a second power supply voltage and the reference resistor node, and the pull-down emphasis driver is coupled between the reference resistor node and a terminal of the ground voltage.

22. The semiconductor apparatus according to claim 21, wherein the second power supply voltage has a voltage level higher than the first power supply voltage.

23. The semiconductor apparatus according to claim 16, wherein the calibration circuit further comprises:

a pull-down resistor leg configured to be set in a resistance value based on the first calibration code;

a pull-up resistor leg configured to be set in a resistance value based on the second calibration code; and a second calibration code generation circuit configured to generate the second calibration code by comparing a voltage level depending on a resistance ratio of the pull-up resistor leg and the pull-down resistor leg with the reference voltage.

\* \* \* \* \*